(12) United States Patent
Stockum et al.

(10) Patent No.: US 8,723,340 B2
(45) Date of Patent: May 13, 2014

(54) PROCESS FOR THE PRODUCTION OF SOLAR CELLS COMPRISING A SELECTIVE EMITTER

(75) Inventors: Werner Stockum, Reinheim (DE); Oliver Doll, Dietzenbach (DE); Ingo Koehler, Reinheim (DE)

(73) Assignee: Merck Patent GmbH, Darmstadt (DE)

( * ) Notice: Subject to any disclaimer, the term of this patent is extended or adjusted under 35 U.S.C. 154(b) by 105 days.

(21) Appl. No.: 13/504,504

(22) PCT Filed: Oct. 1, 2010

(86) PCT No.: PCT/EP2010/006016
§ 371 (c)(1),
(2), (4) Date: Apr. 27, 2012

(87) PCT Pub. No.: WO2011/050889
PCT Pub. Date: May 5, 2011

(65) Prior Publication Data
US 2012/0214270 A1 Aug. 23, 2012

(30) Foreign Application Priority Data

Oct. 30, 2009 (EP) .................................. 09013676
Mar. 15, 2010 (EP) .................................. 10002692

(51) Int. Cl.
*H01L 23/29* (2006.01)

(52) U.S. Cl.
USPC ........... 257/791; 257/347; 257/634; 257/640; 257/E21.006; 257/E21.077; 257/E21.121; 257/E21.127; 257/E21.17; 257/E21.219; 257/E21.227; 257/E21.249; 257/E21.267; 257/E21.278; 257/E21.288; 257/E21.279; 257/E21.292; 257/E21.311; 257/E21.316

(58) Field of Classification Search
USPC ......... 257/791, 347, 352, 354, 607, 634, 640, 257/649, 633, E21.006, E21.077, E21.121, 257/E21.127, E21.17, E21.219, E21.227, 257/E21.249, E21.267, E21.278, E21.288, 257/E21.292, E21.311, E21.316
See application file for complete search history.

(56) References Cited

U.S. PATENT DOCUMENTS

| | | | |
|---|---|---|---|
| 4,252,865 A | 2/1981 | Gilbert et al. | |
| 6,695,903 B1 | 2/2004 | Kuebelbeck et al. | |
| 8,071,418 B2 * | 12/2011 | Rohatgi et al. | 438/87 |
| 8,088,297 B2 * | 1/2012 | Kuebelbeck et al. | 216/79 |
| 8,110,431 B2 * | 2/2012 | Rohatgi et al. | 438/98 |
| 2009/0223549 A1 | 9/2009 | Ounadjela et al. | |

FOREIGN PATENT DOCUMENTS

| | | |
|---|---|---|
| DE | 199 10 816 | 10/2000 |
| DE | 10 2005 032 807 | 1/2007 |
| WO | WO-2007 038297 | 4/2007 |

OTHER PUBLICATIONS

Book, F. et al., "Detailed analysis of high sheet resistance emitters for selectivity doped silicon cells," 24th European Photovoltaic Solar Energy Conference, Sep. 21-25, 2009.

(Continued)

*Primary Examiner* — David Nhu
(74) *Attorney, Agent, or Firm* — Millen, White, Zelano & Branigan, P.C.

(57) ABSTRACT

The present invention relates to a process for the production of solar cells comprising a selective emitter using an improved etching-paste composition which has significantly improved selectivity for silicon layers.

17 Claims, 13 Drawing Sheets

(56) References Cited

OTHER PUBLICATIONS

Figure 1:
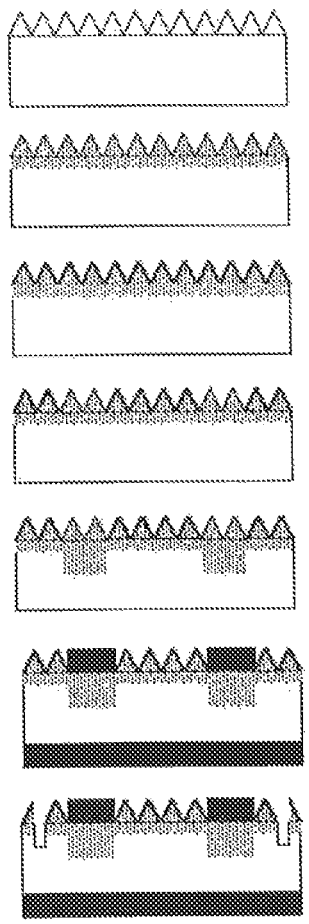

Cech, P. et al., "Application of the printable etching paste for production of crystalline silicon solar cells with selective emitter by one-step diffusion process," 25$^{th}$ European Photovoltaic Solar Energy Conference and Exhibition/ 5$^{th}$ World Conference on Photovoltaic Energy Conversion, Sep. 6-10, 2010.

Dastgheib-Shirazi, A. et al., "A selective emitter for industrial solar cell production: A wet chemical approaching using a single side diffusion process," Proc. 23$^{rd}$, EU PVSEC, Valencia, 2008, pp. 1197.

Dietl, J. et al., "Solar Silicon," Crystals: Growth Properties and Applications, 1981.

Ferrada, P. et al., "Diffusion through semitransparent barriers on P-type silicon wafers," 24$^{th}$ European Photovoltaic Energy Conference, Sep. 21-25, 2009.

Ferrada, P. et al., "Diffusion through semitransparent barriers on p-type silicon wafers," 24$^{th}$ European Photovoltaic Solar Energy Conference, Sep. 21-25, 2009.

International Search Report for PCT/EP2010/006016 dated Feb. 15, 2012.

Lauermann, T. et al., "Insect: An inline selective emitter concept with high efficiencies at competitive process costs improved with inkjet masking technology," Preprint 24$^{th}$ EU PVSEC, Sep. 21-25, 2009.

Wald, F. V. et al., "Crystal Growth of Silicon Ribbons for Terrestrial Solar Cells by the EFG Method," Crystal: Growth Properties and Applications, 1981.

\* cited by examiner

PRIOR ART

Example: Partial section for screen printing

Number of strips about 73, width 1.7 mm
Number of main busbars 2, width 2.0 mm

US 8,723,340 B2

PROCESS FOR THE PRODUCTION OF SOLAR CELLS COMPRISING A SELECTIVE EMITTER

Thus application is 371 application of International Application PCT/EP2010/006016, filed Oct. 1, 2010, which claim benefit of European Applications EP 09013676.3, filed Oct. 30, 2009, and EP 10002692.1, filed Mar. 15,2010.

The present invention relates to a process for the production of solar cells comprising a selective emitter using an improved etching-paste composition which has significantly improved selectivity for silicon layers.

PRIOR ART

Solar cells comprising selective emitters are already being produced in large numbers using known production processes in mass production. The reason for production of solar cells comprising selective emitters is higher efficiency compared with known standard solar cells. This advantage arises through the fact that solar cells comprising selective emitters have considerably lower contact resistance below the metal contact. In addition, improved passivation on the front of the cell and the weakly doped region between the metal contacts arises.

Concepts for the preparation of selective emitters existed as early as the 1970s, but these required two separate processes for diffusion of the phosphorus, where the respective areas not to be doped had to be covered with a mask. This double doping is not only expensive, but is also disadvantageous with respect to the lifetime of the charge carriers generated. This is because double heating of the Si wafers is necessary during the diffusion process in this earlier procedure, which may considerably reduce the life time of the charge carriers in the thin crystalline wafers.

Processes which have in the meantime been developed further are still today also based on these concepts developed at that time.

Thus, A. Dastgheib-Shirazi et al. in a publication of a lecture entitled "Selective Emitter for Industrial Solar Cell Production: A Wet Chemical Approach Using a Single Side Diffusion Process" (Proc. 23$^{rd}$ EU PVSEC, Valencia, 2008, p. 1197) described a process in which selective emitters are generated in mono- and multicrystalline silicon solar cells in a single diffusion step. The wet-chemical wafer etching step here requires masking or screening of the regions on the front where metallisation is to take place by an acid-resistant barrier layer. In this process, wet-chemical process steps are necessary both for the production of the emitter structures and also for the subsequent removal of the acid-resistant barrier layer.

Oxidation for the formation of a barrier layer is also carried out in an intermediate step in the processes for the preparation of selective emitters investigated by P. Ferrada et al. ["Diffusion through semitransparent barriers on p-type silicon wafers" (International Solar Energy Research Center—ISC Constance, Germany; Bosch Solar Energy AG, Germany), 24th European Photovoltaic Energy Conference, 21-25 Sep. 2009, Hamburg]. It was found that high efficiency of the solar cell produced can only be achieved if the barrier layers can be removed completely after phosphorus doping has been carried out and residues of chemicals required for carrying out the various process steps can also be removed in the interim cleaning steps without leaving traces.

Another publication by Dastgheib-Shirazi, A. et al. ["IN-SECT: An inline selective emitter concept with efficiencies at competitive process costs improved with inkjet masking process"; (University of Konstanz, Department of Physics, Konstanz, Germany, Gebr. Schmid GmbH, Germany), Preprint 24$^{th}$ EU PVSEC, Sep. 21-25, 2009, Hamburg] describes the preparation of selective emitters on monocrystalline wafers, where an in-line diffusion step for the formation of the emitters is carried out after chemical texturing under alkaline conditions. However, it is necessary in this method to protect areas which are subsequently to be metallised by means of an acid-resistant, hot-melting wax. The unprotected regions of the surface are etched, as described in the first-mentioned publication by the same author. After removal of the masking, the treated wafers are subsequently cleaned before being provided with a PECVD-SiN$_x$AR layer. The metallisation is carried out by a screen-printing process and by sintering.

Figure 2:
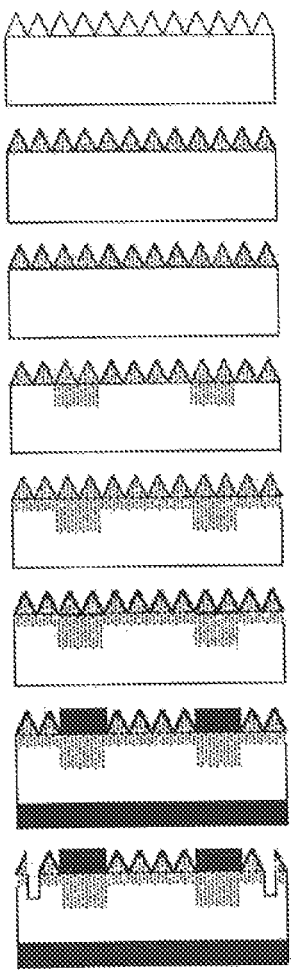

The process flow charts in FIG. 1 and FIG. 2 show the process steps which have hitherto been carried out in the preparation of two-step selective emitters. These preparation methods have already been introduced into the industrial production of solar cells.

In process variant A, as depicted in FIG. 1, the production of solar cells comprising selective emitters comprises the following steps:
1. Texturing of the surface with a pyramidal structure
2. Phosphorus doping (100 Ω/diffusion of POCl$_3$) and PSG etching
3. Masking (PE-CVD SiN$_x$)
4. Selective opening of the masking by etching with etching pastes or by laser
5. Phosphorus doping (40 Ω/sq diffusion of POCl$_3$) and PSG etching
6. Screen printing for the metallisation surface and back/sintering
7. Edge insulation In process variant B, as depicted in FIG. 2, the production of solar cells comprising selective emitters comprises the following eight steps:
1. Texturing of the surface with a pyramidal structure
2. Masking by thermal deposition of SiO$_2$
3. Selective opening of the masking by etching with etching pastes or by laser
4. Phosphorus doping (40 Ω/sq diffusion of POCl$_3$) and PSG etching
5. Phosphorus doping (100 Ω/sq diffusion of POCl$_3$) and PSG etching
6. Masking with an antireflective layer (ARC deposition) by means of plasma enhanced chemical vapour deposition (PECVD) of silicon nitride (SiN$_x$)
7. Screen printing for the metallisation surface (front) and back with subsequent sintering (co-firing)
8. Edge insulation A process variant C, as depicted in FIG. 3, has been known since 2007 (presented at the PVSEC Conference 2007), which enables the production of solar cells comprising one-step selective emitters which have adequate efficiencies and are process-capable.

Figure 3:
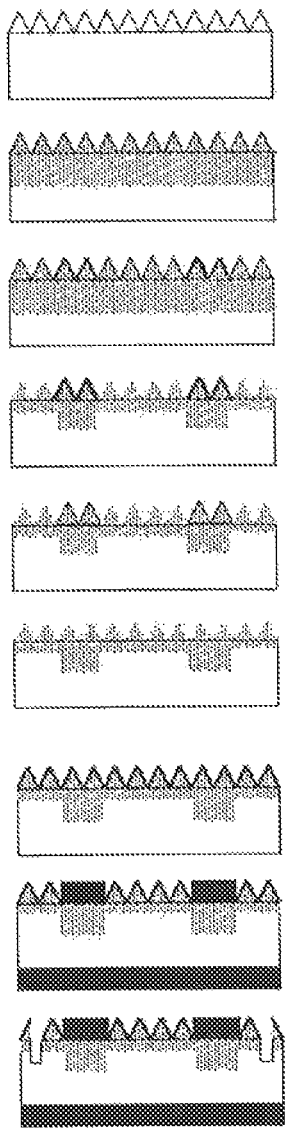

This process variant C comprises the following nine steps, which are also depicted in FIG. 3:
1. Texturing of the surface with pyramidal structures
2. Phosphorus doping (40 Ω/sq diffusion of POCl$_3$)
3. Local application of the etching mask by ink-jet printing
4. Local etching of the PSG and silicon layers with an HF/HNO$_3$ solution in order to achieve a conductivity of 100 Ω/sq (PSG=phosphosilicate glass)
5. Removal (stripping) of the etching mask
6. PSG etching 7. Masking with an antireflective layer (ARC deposition) by means of plasma enhanced chemical vapour deposition (PECVD) of silicon nitride ($SiN_x$)
8. Screen printing for the metallisation surface (front) and back with subsequent sintering (co-firing)
9. Edge insulation In this process variant, the wafer is only doped strongly once over the entire surface. For this purpose, the wafer is treated with $POCl_3$ at temperatures of about 800-850° C. for about one hour, during which phosphorus diffuses into the surface of the wafer. At the same time, the conductivity is thereby set to about 50 ohm/sq ($\Omega$/sq). A polymer paste is subsequently printed on in a special screen layout, i.e. a line pattern. After drying, the polymer present in the cured paste is resistant to attack by an acid mixture consisting of HF and $HNO_3$ and acts as etch resist. The printed and dried wafer is dipped into a corresponding $HF/HNO_3$ acid mixture, and the unprinted wafer areas are etched off. For the etching step, the etch-bath concentration and the residence time therein are adjusted to the desired etching depth or to the desired layer resistance. The etching is terminated when a layer resistance of 100 ohm/sq has been reached.

In the next process step in this process, the polymer (etch resist) is removed again with the aid of an alkaline solution. It is subsequently possible to remove the PSG (phosphosilicate glass) covered by a polymer layer (resist) with the aid of hydrofluoric acid. The wafer is rinsed, dried and sent to deposition of the ARC layer (antireflective layer). This masking with an antireflective layer (ARC deposition is carried out by means of plasma enhanced chemical vapour deposition (PECVD) of silicon nitride ($SiN_x$). A silver paste is printed for front contacting and an aluminium paste as back surface field and fired (dried by heating) in a belt furnace. In the final process step, the edge insulation on the front is carried out by means of a laser.

A disadvantage of this process for the production of solar cells comprising selective emitters is the large number of process steps, which are time-consuming and expensive.

Object

The object of the present invention is therefore to provide a process for the production of solar cells comprising selective emitters and having high efficiency which is simple to carry out and which enables time and costs as well as process steps to be saved. A further object of the present invention is to provide a corresponding process by means of which solar cells having an increased lifetime of the charge carriers generated by the doping in the relatively thin wafers are obtained.

Subject-matter of the Invention

Experiments with various etching-paste compositions have surprisingly shown that this object can be achieved by the use of novel phosphoric acid-containing etching-paste compositions and a modification to the process.

The present invention thus relates to a process for the production of solar cells comprising selective emitters with one-step diffusion, which is characterised in that a phosphosilicate glass layer (PSG or PSG layer) and an underlying silicon layer are etched with an etching paste.

This process according to the invention differs from processes known to date, in particular, through the fact that the formation of the selective emitter is carried out using a phosphoric acid-containing etching paste which etches a phosphosilicate glass layer (PSG or PSG layer) and an underlying silicon layer in one process step.

It has proven particularly advantageous in the process according to the invention that the etching of the phosphosilicate glass layer (PSG or PSG layer) and an underlying silicon layer produces a silicon surface having increased microroughness compared with the actual texture, since the solar cell produced by the process consequently has increased efficiency.

The process according to the invention can advantageously be designed in such a way that, after texturing of the surface of the silicon wafer with a pyramidal or amorphous structure, the surface is treated with a phosphoric acid-containing etching paste, producing increased microroughness of the actual texture.

In a preferred embodiment (FIG. 4), the process according to the invention for the production of solar cells comprising one-step emitters comprises the following process steps:
I. Texturing of the surface
II. Phosphorus doping (~40 $\Omega$/sq diffusion of $POCl_3$)
III. Local etching of the PSG and silicon layers, producing a conductivity in the range ~90-100 $\Omega$/sq (PSG=phosphosilicate glass), and cleaning of the wafer
IV. PSG etching
V. Masking with an antireflective layer (ARC deposition) by means of plasma enhanced chemical vapour deposition (PECVD) of silicon nitride ($Si\,N_x$)
VI. Screen printing for metallisation of the surface (front) and back with subsequent sintering (co-firing)
VII. Edge insulation.

Figure 5:
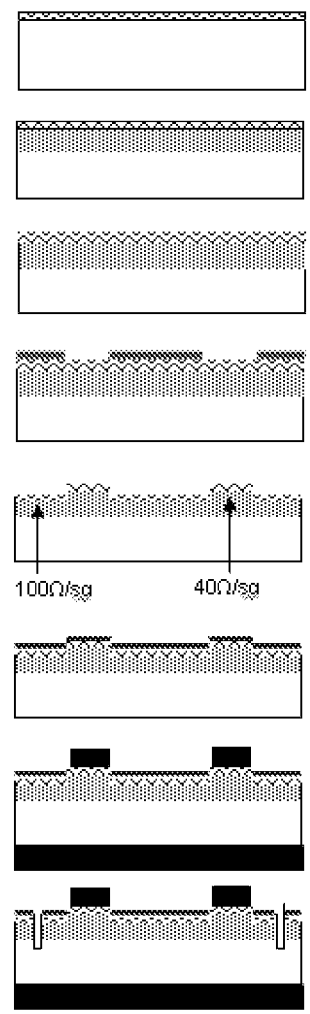

However, it is also possible to carry out the process by carrying out the process steps in a modified sequence. This gives a comparable result. After modification of the sequence, as shown in FIG. 5, the modified process according to the invention for the production of solar cells comprising one-step emitters comprises the following process steps:
I. Texturing of the surface
II. Phosphorus doping (~40 $\Omega$/sq diffusion of $POCl_3$)
III. PSG etching
IV. Local etching of the silicon layer and cleaning of the wafer, producing a conductivity in the range ~90-100 $\Omega$/sq
V. Masking with an antireflective layer (ARC deposition) by means of plasma enhanced chemical vapour deposition (PCVD) of silicon nitride ($Si\,N_x$)
VI. Screen printing for metallisation of the surface (front) and back with subsequent sintering (co-firing)
VII. Edge insulation.

The wafer is cleaned immediately after the etching. In both embodiments, the wafer can be cleaned with deionised water and/or 0.05% KOH solution.

Figure 6:
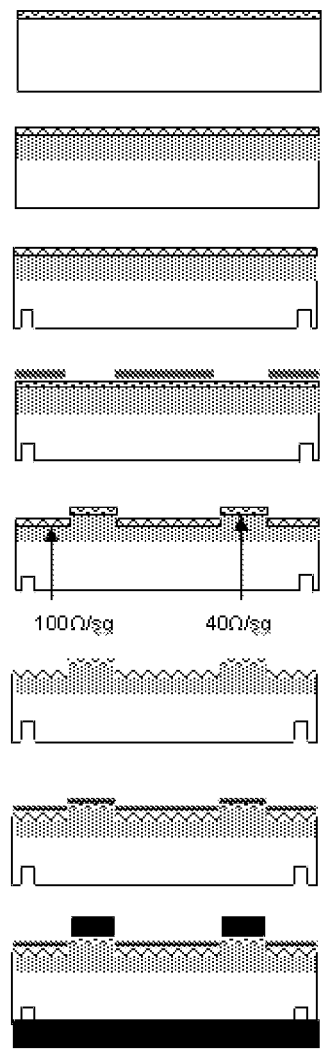

If back edge insulation is carried out at the same time, the process according to the invention for the production of solar cells comprising one-step emitters comprises the following process steps (see FIG. 6):
I. Texturing of the surface
II. Phosphorus doping (~40 $\Omega$/sq diffusion of $POCl_3$)
III. Back edge insulation with SolarEtch SiD paste, or etching over the entire back surface with HNO3/HF solution
IV. Local etching of the silicon layer, producing a conductivity in the range ~90-100 $\Omega$/sq (PSG=phosphosilicate glass)
V. Cleaning of the wafer with deionised water and/or 0.05% KOH solution
VI. PSG etching
VII. Masking with an antireflective layer (ARC deposition) by means of plasma enhanced chemical vapour deposition (PECVD) of silicon nitride ($Si\,N_x$)
VIII. Screen printing for metallisation of the surface (front) and back with subsequent sintering (co-firing).

Figure 7:
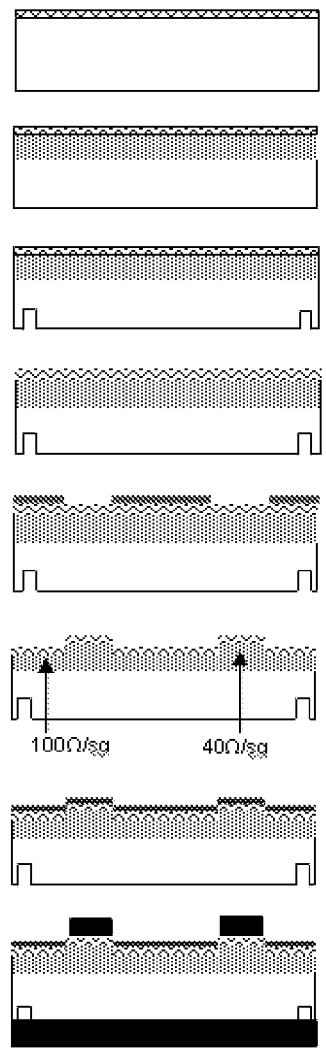

In this case too, it is possible to carry out the various process steps in a modified sequence. After modification of the sequence (see FIG. 7) and back edge insulation, the process according to the invention for the production of solar cells comprising one-step emitters comprises the process steps in the following sequence:

I. Texturing of the surface
II. Phosphorus doping (~40 Ω/sq diffusion of $POCl_3$)
III. Back edge insulation with SolarEtch SiD paste, or etching over the entire back surface with HNO3/HF solution
IV. PSG etching
V. Local etching of the silicon layer, producing a conductivity in the range ~90-100 Ω/sq
VI. Cleaning of the wafer with deionised water and/or 0.05% KOH solution
VII. Masking with an antireflective layer (ARC deposition) by means of plasma enhanced chemical vapour deposition (PECVD) of silicon nitride (Si $N_x$)
VIII. Screen printing for metallisation of the surface (front) and back with subsequent sintering (co-firing).

In particular, the use of a phosphoric acid-containing etching paste which can be employed in the process described for the production of solar cells comprising selective emitters contributes to achieving the object according to the invention.

For this purpose, phosphoric acid-containing etching pastes which comprise phosphoric acid in an amount of 25 to 80% by weight are particularly suitable.

Besides the phosphoric acid, these pastes according to the invention comprise a solvent or solvent mixture in an amount of 20 to 40% by weight. Particularly suitable solvents in this case are solvents selected from the group glycerol, diethylene glycol monomethyl ether, diethylene glycol monoethyl ether, dimethyl sulfoxide and gamma-butyrolactone, which can be employed in pure form or as a mixture.

These compositions preferably comprise at least one non-particulate thickener. In particular, non-particulate thickeners selected from the group polyvinylpyrrolidone and hydroxypropylcellulose, which can be present in pure form or as a mixture, are suitable in these pastes. Corresponding pastes which comprise a particulate thickener selected from the group carbon black, low-melting wax particles, in pure form or as a mixture, have particularly good properties.

Pastes which comprise both non-particulate and particulate thickeners are very particularly suitable for use in the process according to the invention. Corresponding thickeners are preferably present in the pastes in an amount of 20-35% by weight.

DETAILED DESCRIPTION OF THE INVENTION

Experiments have surprisingly shown that the use of a novel phosphoric acid-containing etching-paste formulation enables very good etching results to be achieved in the etching of phosphosilicate glass (PSG or phosphorus glass).

An underlying silicon layer can advantageously be etched at the same time. Etching experiments with the novel etching-paste formulations have shown that the latter have good selectivity for silicon layers, meaning that uniform and complete etching can be carried out.

It has been found that the integration of the novel etching-paste compositions enables the process for the production of solar cells comprising a selective emitter to be successfully simplified and reduced in cost. The simultaneous etching of the PSG and underlying silicon layers, but in particular also the complete etching of the silicon layer, has the consequence that the improved process in accordance with the present invention enables the production of solar cells comprising selective emitters and one-step doping which have higher efficiency.

In the process according to the invention, the wafer is strongly doped over the entire surface after the acidic texturing with HF and $HNO_3$ or alkaline texturing with KOH and isopropanol. For this purpose, doping is carried out with phosphorus using $POCl_3$ at temperatures of about 800-850° C. during a residence time of about 30 to 90 minutes. The doping adjusts the conductivity of the cell front to about 35-50 ohm/sq. The novel etching paste is subsequently printed printed onto the front with a special screen layout, preferably with a broad line pattern (1.7 mm line width and 200 μm line separation), and the printed wafer is heated. The wafer surface is heated to a temperature of 300° C. to 380° C. The heating duration is in the range from 1 min to 3 min. The heating is preferably carried out in a belt furnace. During the heating step, both the PSG layer layer and the silicon layer are etched. The etching is complete when a layer resistance in the range from 90 to 100 ohm/sq has been reached. After simple cleaning with deionised water and/or with a basic KOH solution (0.05% to 1%), the PSG (phosphorus glass) is removed in the next process step with the aid of hydrofluoric acid. The wafer is re-rinsed with deionised water, dried and sent sent to deposition of the ARC layer (antireflective layer). For this purpose, silicon nitride is preferably deposited PE-CVD (PECVD=plasma enhanced chemical vapour deposition). A silver paste is printed onto the front for front contacting and an aluminium paste is printed onto the back for back contacting, and the wafers treated in this way are heated (dried by heating) in a belt furnace. The edge insulation is carried out by means of a laser.

Figure 4:
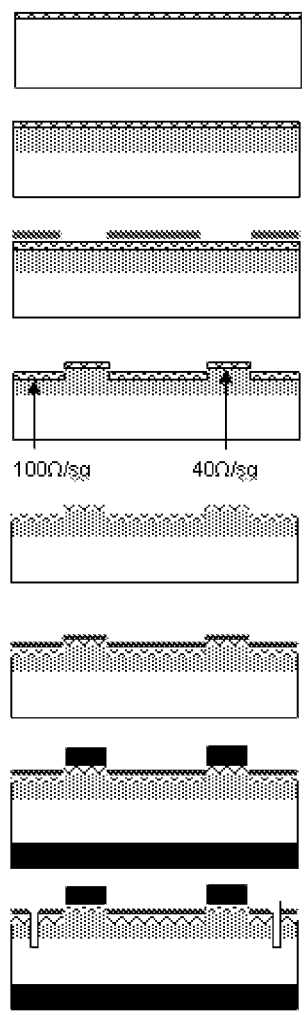

Accordingly, the process according to the invention for the production of solar cells comprising a selective emitter and one-step doping using the etching-paste composition according to the invention comprises the following process steps, which are shown in FIG. 4:

1. Texturing of the surface with pyramidal structures
2. Phosphorus doping (~40 Ω/sq diffusion of $POCl_3$)
3. Local etching of the PSG and silicon layers with an etching paste according to the invention in order to produce a conductivity of ~100 Ω/sq (PSG=phosphosilicate glass)
4. PSG etching
5. Deposition of the antireflective layer (ARC deposition) by means of plasma enhanced chemical vapour deposition (PECVD) of silicon nitride ($SiN_x$)
6. Screen printing for metallisation of the surface (front) and back with subsequent sintering (co-firing)
7. Edge insulation Compared with the known process for the production of solar cells comprising a selective emitter, the process according to the invention comprises only seven process steps. It is thus possible, through the modified process using the etching-paste compositions according to the invention, to save both time and also chemicals which would have been necessary for the two omitted steps. The entire production process is thus also less expensive at the same time.

For the production of solar cells comprising selective emitters, the process according to the invention and the solar cells produced thereby exhibit the following advantages over the known processes A, B and C:

1. fewer process steps for the production of solar cells comprising selective emitters (for example only seven process steps instead of the usual nine process steps);

2. lower costs for carrying out the entire process;
3. more environmentally friendly process since an etching step with an acid mixture consisting of an HF/HNO$_3$ mixture is omitted and the formation of nitrous gases is thereby avoided;
4. the solar cells obtained have higher efficiency or higher cell efficiency than standard solar cells.

Besides these process advantages and the higher efficiency of the solar cells produced, it has been found, surprisingly, that the silicon surface has increased roughness after etching with the novel, phosphoric acid-containing etching paste according to the invention. This increased roughness further increases the antireflective action of the already textured surface. This in turn has a positive influence on the efficiency of the solar cell produced.

This increased roughness is very readily visible on photomicrographs with 1000 times magnification.

Figure 8:
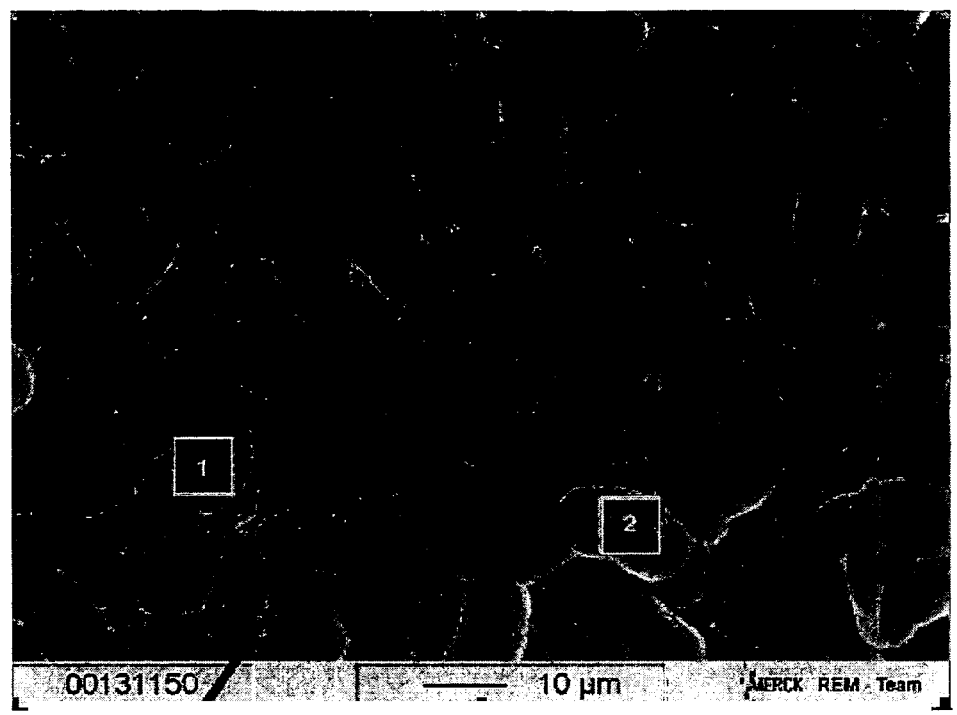

In FIG. 8, part of the surface of a wafer is treated correspondingly, while the other part is untreated, i.e. the area to the right of the bar is untreated and the area on the left-hand side of the bar has additionally been etched with the etching paste according to the invention. It can clearly be seen that area 1 (left-hand side) exhibits significantly higher surface roughness of the graining compared with the unetched area 2 (right-hand side). This clearly visible microroughness on the actual texture reduces sunlight reflection and thus at the same time results in an increase in efficiency of the solar cell.

Figure 9:
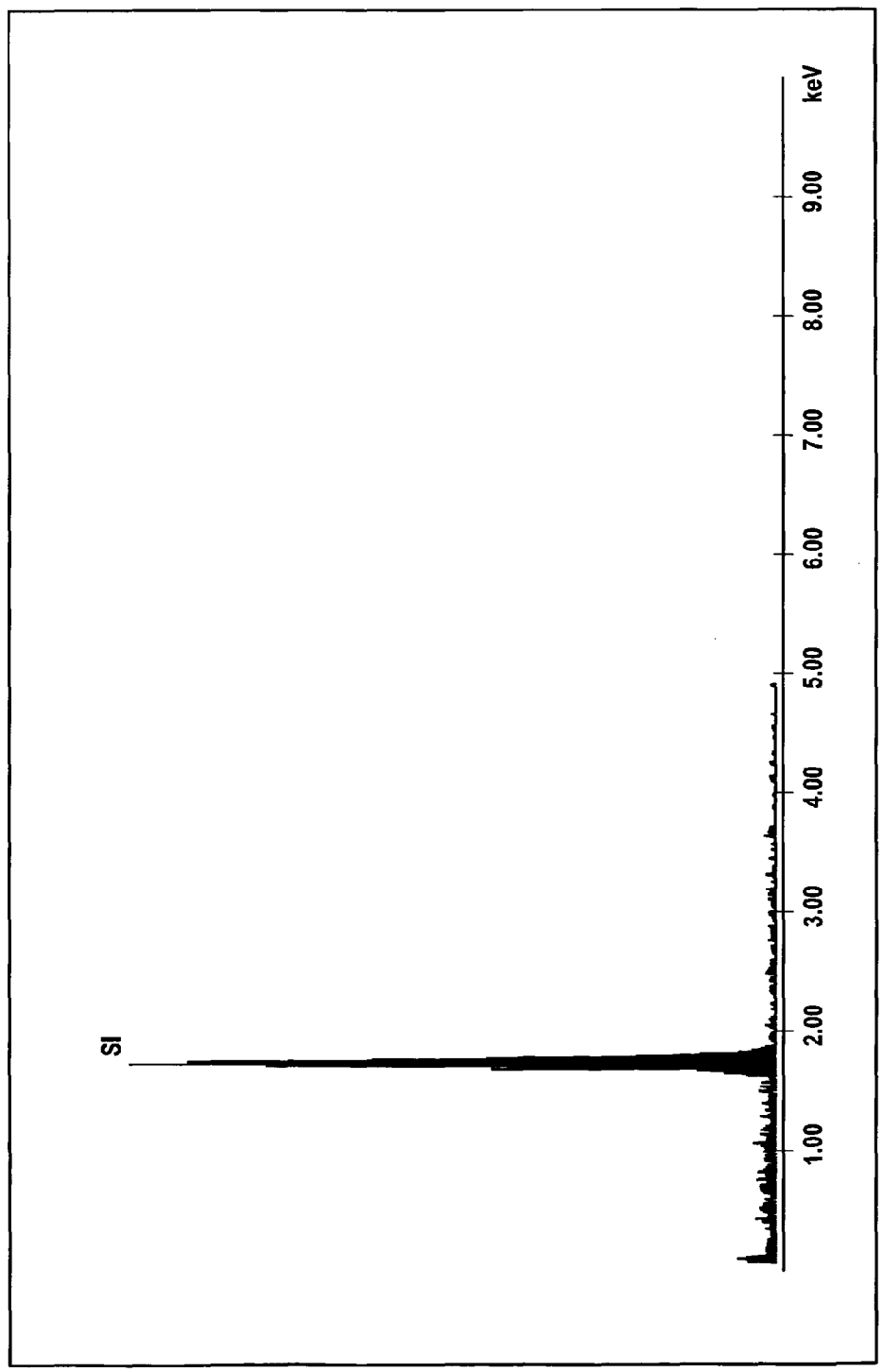
Figure 10:
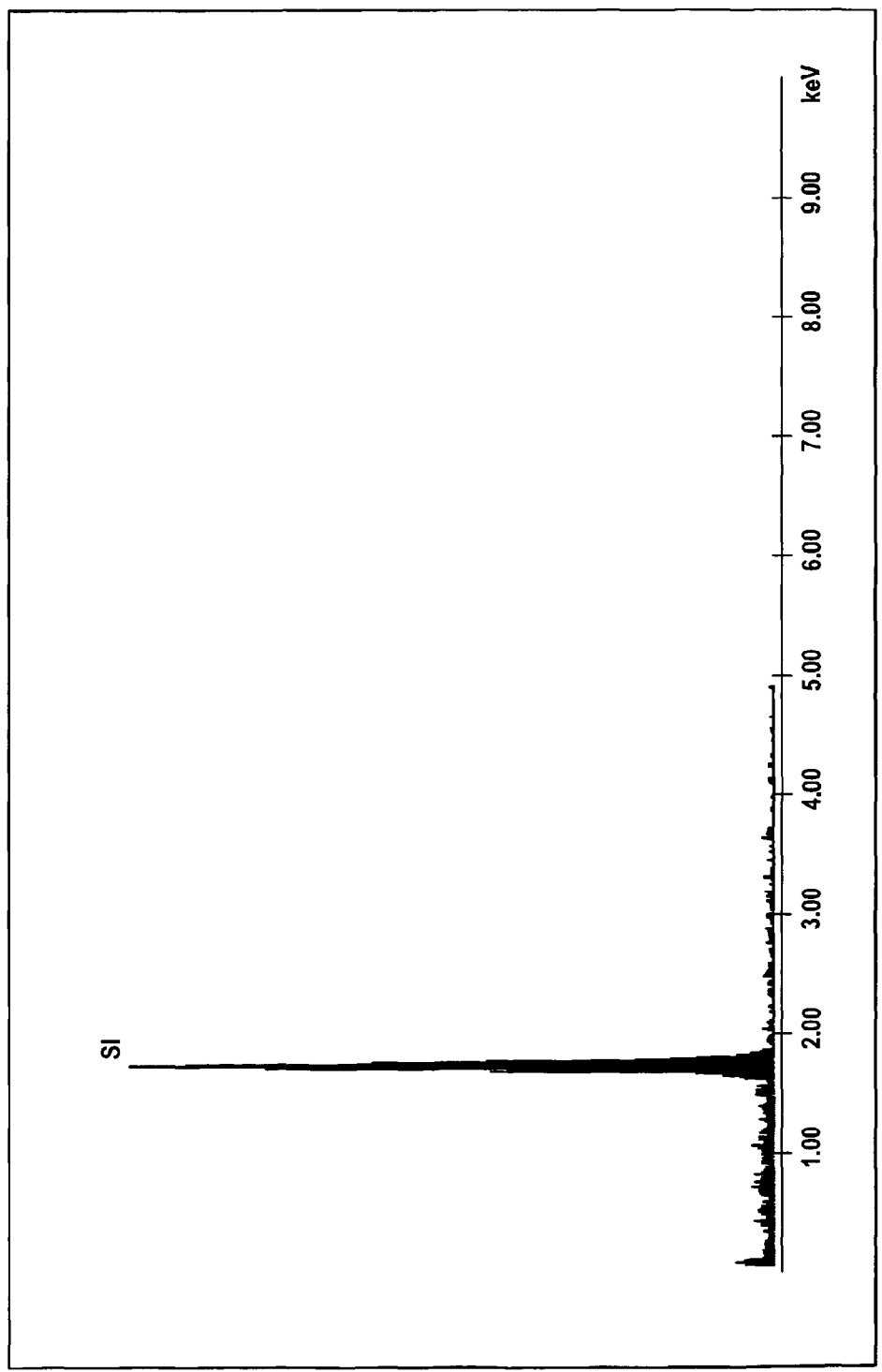

Through a corresponding analysis, it can be shown that both the area of the silicon surface etched with the etching paste according to the invention and also the unetched area of the silicon surface consist of pure silicon and, after cleaning, are not contaminated with diffused-in phosphorus or as a consequence of the use of an etching paste. This determination is possible without great effort by means of EDX analysis. As can be seen in FIGS. 9 and 10, the EDX analyses of both the etched and unetched surfaces show that both surfaces consist of comparably pure silicon. The EDX analysis is an energy-dispersive X-ray analysis, which allows fast and highly accurate element determination in the material analysis.

Monocrystalline or multicrystalline solar cells are typically cut out of solid, drawn silicon rods or cast silicon blocks with the aid of wire saws (Dietl J., Helmreich D., Sirtl E., Crystals: Growth, Properties and Applications, Vol. 5 Springer Verlag 1981, pp. 57 and 73). An exception therefrom is formed by silicon drawn by the EFG (edge-defined film-fed growth) process (Wald, F. V.; Crystals: Growth, Properties and Applications, Vol. 5 Springer Verlag 1981, p. 157).

For the production of solar cells comprising one-step emitters by the process according to the invention, it is possible to employ correspondingly produced monocrystalline or polycrystalline silicon wafers, which may in turn be doped with boron [p-type silicon, 5" size (125×125 mm, D 150 mm), thickness: 200-260 µm, resistance: 1.0-1.5 Ω.cm].

As already indicated above, the wafers are usually sawn out of mono- or poly-crystalline silicon rods. The sawn mono- or multicrystalline silicon wafers obtained in this way have a rough surface, also known as saw damage, with roughness depths of about 20-30 µm. For further processing of the wafers into solar cells, but in particular in order to achieve the highest possible efficiency, a so-called saw damage etch is necessary. In this saw damage etch, the contamination present in the trenches in the surface is removed in addition to the actually intended removal of the saw damage (a very heavily damaged surface region of the wafer with a depth of several µm). This contamination is, in particular, metal abrasion from the saw wire, but also traces of abrasive. An etching of this type is typically carried out in approximately 30% potassium hydroxide solution or sodium hydroxide solution at temperatures of about 70° C., preferably higher, in particular at 90° C. Due to the relatively low etching rates of about 2 µm/min under these conditions, etching times of 10 minutes and possibly longer may be necessary in order to achieve the desired effect. An Si layer with a thickness of about 7 µm is usually removed on both sides of the wafer in this way.

This etching produces a rough surface on the substrate. However, the aperture angles achieved at the surface are very flat and totally unsuitable for reducing reflections or even for reducing multiple reflections at the surface. However, reflection effects of this type are desired in order to achieve high efficiencies of the cell. A multiplicity of publications and patents therefore deals with the reduction in reflections on solar cells of any type, for example also for amorphous solar cells (for example in U.S. Pat. No. 4,252,865 A).

LIST OF FIGURES WITH EXPLANATIONS

FIG. 1: Process variant A of a standard process for the production of solar cells comprising a selective emitter with two-step doping
The steps depicted in this figure are the following:
1. Texturing (in this step, the surface texturing with KOH/isopropanol or HF/HNO$_3$ is carried out)
2. PSG etching, or phosphorus doping (PSG=phosphosilicate glass), 100 Ω/sq diffusion (POCl$_3$)
3. Deposition of the antireflective layer by plasma enhanced chemical vapour deposition (PECVD) of silicon nitride (PECVD SiN$_x$)
4. Opening of the masking using etching paste or laser
5. PSG etching, 40 Ω/sq diffusion (POCl$_3$)
6. Screen printing for metallisation of the surface on the front and back with subsequent sintering (co-firing)
7. Edge insulation FIG. 2: Process variant B of a standard process for the production of solar cells comprising a selective emitter with two-step doping
The steps depicted in this figure are the following:
1. Texturing (in this step, the surface texturing with KOH/isopropanol or HF/HNO$_3$ is carried out)
2. Masking (thermal deposition of SiO$_2$)
3. Opening of the masking using etching paste or laser
4. PSG etching, 40 Ω/sq diffusion (POCl$_3$)
5. PSG etching, 100 Ω/sq diffusion (POCl$_3$)
6. Deposition of an antireflective coating (ARC) by plasma enhanced chemical vapour deposition (PECVD) for the deposition of silicon nitride (SiN$_x$)
7. Screen printing for metallisation of the surface on the front and back with subsequent sintering (co-firing)
8. Edge insulation FIG. 3: Process variant C of a newer process for the production of solar cells comprising a selective emitter with one-step doping, comprising nine process steps
The steps depicted in this figure are the following:
1. Texturing (in this step, the surface texturing with KOH/isopropanol or HF/HNO$_3$ is carried out)
2. PSG etching, 40 Ω/sq diffusion (POCl$_3$)
3. Local ink-jet printing of an etching mask
4. Local etching of the PSG layer (phosphosilicate glass layer) and the silicon layer with HF/HNO$_3$ solution in order to obtain a conductivity of 100 Ω/sq
5. Detachment of the etching mask
6. PSG etching 7. Deposition of an antireflective coating (ARC) by plasma enhanced chemical vapour deposition (PECVD) for the deposition of silicon nitride ($SiN_x$)
8. Screen printing on the front and back for metallisation of the surface on the front and back with subsequent sintering
9. Edge insulation FIG. 4: Depiction of the process according to the invention
The steps depicted in this figure are the following:
1. Texturing (in this step, the surface texturing with KOH/isopropanol or $HF/HNO_3$ is carried out)
2. PSG etching, 40 Ω/sq diffusion ($POCl_3$)
3. Printing-on of Solar Etch®, local etching of the PSG layer (phosphosilicate glass layer) and silicon layer in order to obtain a resistance of 100 Ω/sq
4. Cleaning with deionised water and/or 0.05% KOH solution
5. PSG etching
6. Deposition of an antireflective coating (ARC) by plasma enhanced chemical vapour deposition (PECVD) for the deposition of silicon nitride ($SiN_x$)
7. Screen printing on the front and back for metallisation of the surface on the front and back with subsequent sintering
8. Edge insulation FIG. 5: Depiction of the process in modified sequence
The steps depicted in this figure are the following:
1. Texturing (in this step, the surface texturing with KOH/isopropanol or $HF/HNO_3$ is carried out)
2. PSG etching, 40 Ω/sq diffusion ($POCl_3$)
3. PSG etching
4. Printing-on of Solar Etch®, Si etching, in order to obtain a resistance of 100 Ω/sq
5. Cleaning with deionised water and/or 0.05% KoH solution
6. Deposition of an antireflective coating (ARC) by plasma enhanced chemical vapour deposition (PECVD) for the deposition of silicon nitride ($SiN_x$)
7. Screen printing on the front and back for metallisation of the surface on the front and back with subsequent sintering
8. Edge insulation FIG. 6: Depiction of the process according to the invention with back edge insulation
The steps depicted in this figure are the following:
1. Texturing (in this step, the surface texturing with KOH/isopropanol or $HF/HNO_3$ is carried out)
2. PSG etching, 40 Ω/sq diffusion ($POCl_3$)
3. Back edge insulation with SolarEtch SiD or $HNO_3/HF$
4. Printing-on of Solar Etch®, local PSG (phosphosilicate glass) and Si etching in order to obtain a resistance of 100 Ω/sq
5. Cleaning with deionised water and/or 0.05% KoH solution
6. PSG etching
7. Deposition of an antireflective coating (ARC) by plasma enhanced chemical vapour deposition (PECVD) for the deposition of silicon nitride ($SiN_x$)
8. Screen printing on the front and back for metallisation of the surface on the front and back with subsequent sintering FIG. 7: Depiction of the process in modified sequence with back edge insulation
The steps depicted in this figure are the following:
1. Texturing (in this step, the surface texturing with KOH/isopropanol or $HF/HNO_3$ is carried out)
2. PSG etching, 40 Ω/sq diffusion ($POCl_3$)
3. Back edge insulation with SolarEtch SiD or $HNO_3/HF$
4. PSG etching
5. Printing-on of Solar Etch®, Si etching in order to obtain a resistance of 100 Ω/sq
6. Cleaning with deionised water and/or 0.05% KOH solution
7. Deposition of an antireflective coating (ARC) by plasma enhanced chemical vapour deposition (PECVD) for the deposition of silicon nitride ($SiN_x$)
8. Screen printing on the front and back/sintering (co-firing)

FIG. 8: Effect of the etching pastes according to the invention on silicon surfaces, photomicrograph with 1000 times magnification which shows the treated silicon surface on the left-hand side of the marking and the untreated surface on the right-hand side FIG. 9: EDX analysis of area 1 in FIG. 8 which has been treated with the etching paste according to the invention FIG. 10: EDX analysis of the untreated area 1 in FIG. 8

Figure 11:
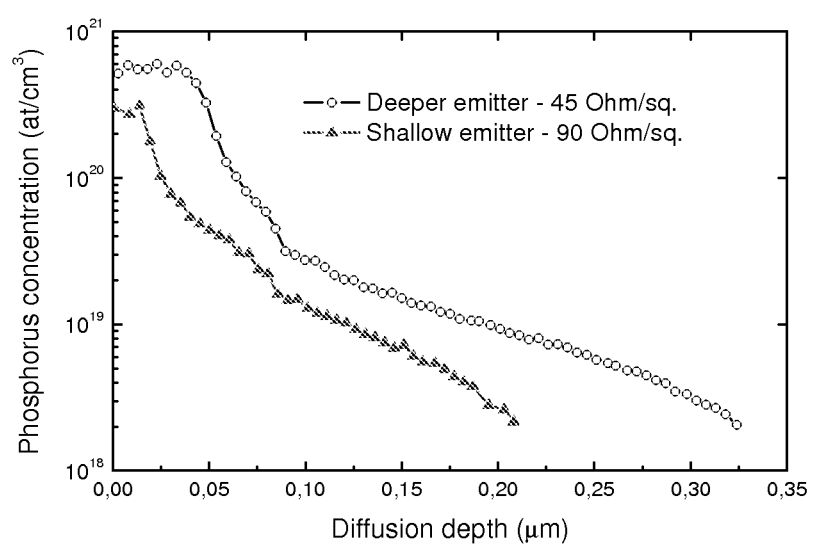
Figure 12:
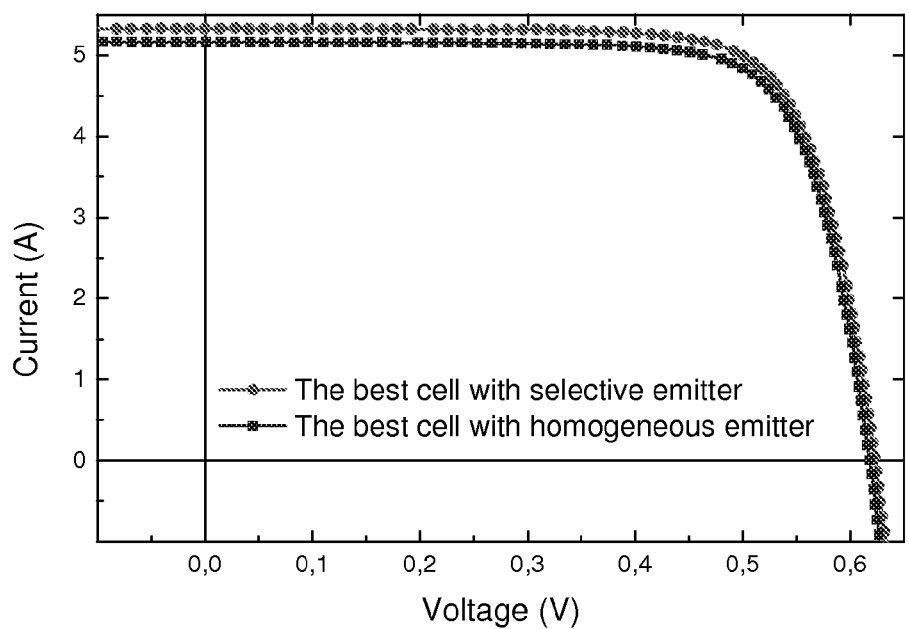

FIG. 11: ECV profile for the phosphorus concentration of the "shallow" emitter and the "deep" emitter on a polished Si wafer FIG. 12: Depiction of the efficiency of a solar cell comprising a one-step emitter produced in accordance with the invention compared with a standard solar cell through current/voltage characteristic line
Measurements:
Isc=5.283 A; Isc=5.165
Voc=625 mV; Voc=618 mV
FF=76.2%; FF=76.4%
Eff =16.94%; Eff=16.40%

Figure 13:
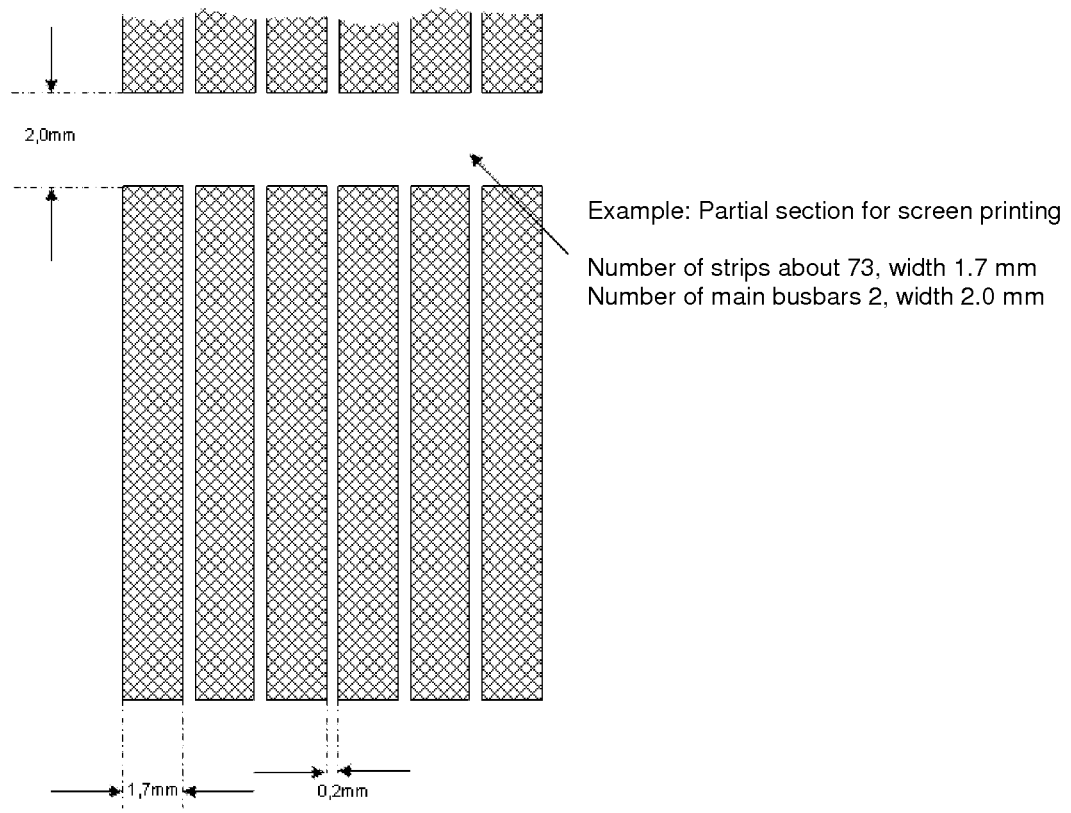

FIG. 13: Example of a possible print layout (screen section) for the production of a selective emitter structure on a wafer As an example, a partial section for a printing screen is shown (number of strips about 73, width 1.7 mm, number of main busbars 2, width 2.0 mm)

In the further description, examples of the process according to the invention for the production of solar cells comprising one-step emitters and the etching pastes used therein which are within the scope of protection of the present invention are given for better understanding and in order to illustrate the invention. These examples also serve to illustrate possible process variants or possible variations of suitable paste compositions for the etching step. Owing to the general validity of the inventive principle described, however, the examples are not suitable for reducing the scope of protection of the present application to these alone.

The temperatures given in the examples and description and in the claims are always in ° C. Unless indicated otherwise, contents data are given as % by weight or weight ratios.

Furthermore, it goes without saying to the person skilled in the art that, both in the examples given and in the remainder of the description, the component amounts present in the compositions always add up to only 100% by weight, 100 mol % or 100% by volume, based on the composition as a whole, and cannot exceed this, even if higher values could arise from the per cent ranges indicated. Unless indicated otherwise, % data are % by weight, with the exception of ratios shown in volume data.

Production of Solar Cells According to the Invention:

A reduction in the reflection of solar cells is usually achieved by texturing with an alkaline solution, preferably comprising an NaOH solution and isopropanol, or with an acidic solution consisting of an acid mixture of HF and $HNO_3$.

After texturing, the surface is cleaned with acid-containing, aqueous solutions, with hot demineralised water or by treatment in a heating oven in the following sequence: HF, HCl, HF, hot demineralised water, HF, treatment in a heating oven.

After the cleaning of the wafer surface, the one-step emitter (deep emitter) is formed in a diffusion step. This is a batch process, in which the surface of the wafer is doped with phosphorus over the course of about one hour, preferably over the course of about 70 minutes, at a temperature of higher than 800° C., at most 895° C. Liquid $POCl_3$ is employed for the doping. After about 70 minutes, the desired conductivity of about 40 ohm/sq has been reached.

So-called "shallow emitters" are produced in the silicon wafers by etching with suitable etching pastes, where the etching paste is applied by screen printing.

For example, a phosphoric acid-containing etching paste, such as, for example, isishape SolarEtch BES, can be employed for this purpose, or alternatively a KOH-containing etching paste, such as isishape SolarEtch SiS (comprises KOH), can be employed for the etching step.

The paste can be applied using a screen-printing machine which is sold under the name "Baccini printer" (with four cameras). The etching pastes can be printed using, for example, a screen from Koenen with the specification 280 mesh/inch and a wire diameter of 25 µm. The mounting angle of the screen is preferably 22.4°. The screen emulsion used is Azokol Z130 from Kissel & Wolf. The paste can be printed very well using a diamond doctor having a doctor hardness of 80 shore.

The following parameters are set for the paste printing:
separation: 1.2 mm; pressure: 70 N;
speed: 150 mm/s.

The etching paste is applied with a line width of 1.7 mm and a line separation of 200 µm (see sketch in FIG. 13). For the etching, the printed wafer is heated at up to 400° C. for a period of about 5 minutes (the etching paste is activated in this way). A belt furnace is used for this purpose. The furnace is divided into four heating zones. Zone 1 is set to 550° C., zone 2 to 400° C., zone 3 to 400° C. and zone 4 to 300° C. The belt speed is 51 cm/min. The etched wafer is then cleaned using a Schmid in-line cleaning unit. The cleaning is carried out in two steps. In the first step, the wafer is cleaned in a pass-through ultrasound bath (2×500 W, 40 kHz) and in the second step on both sides using a water jet and subsequently dried (compressed air). The PSG etching and wet-chemical surface cleaning are carried out with HF, hot demineralised water and again with HF.

The LPCVD $SiN_x$ deposition on one side (LPCVD=low pressure chemical vapour deposition) is carried out at up to 790° C. The process duration for the deposition of a layer thickness of 90 nm is 2 h.

The reaction gases used for the deposition of $Si_3N_4$ are dichlorosilane and $NH_3$.

The edge insulation can be carried out by in-line laser edge insulation, but can also be carried out by a suitable etching process.

The requisite back contacts are produced under the following conditions:

The paste is applied using a screen-printing machine which is sold under the name "Baccini printer" (with four cameras). Ag/Al paste is used as standard. For the process described, DuPont PV 502 paste is used. The paste is printed using, for example, a screen from Koenen with the specification 230 mesh/inch and a wire diameter of 36 µm. The mounting angle of the screen is preferably 45°. The screen emulsion used is ISAR from Koenen. The paste can be printed very well using a diamond doctor having a doctor hardness of 60 shore. The following parameters are set for the paste printing: separation: 1.2 mm; pressure: 70 N; speed: 150 mm/s. Two busbars measuring 5 mm×124 mm are printed on the back using the Ag/Al paste. The printed paste thickness is about 15 µm. For drying, the printed wafer is warmed at up to 200° C. for a period of about 3 minutes. A belt furnace is used for this purpose.

Aluminium BSF Contact:

The paste is applied using a screen-printing machine which is sold under the name "Baccini printer" (with four cameras). For the process described, the DuPont Comp. PV 381 aluminium paste is used. The paste can be printed using, for example, a screen from Koenen with the specification 330 mesh/inch and a wire diameter of 34 µm. The mounting angle of the screen is preferably 45°. The screen emulsion used is ISAR from Koenen. The paste can be printed very well using a diamond doctor and a doctor hardness of 60 shore. The following parameters are set for the paste printing: separation: 1.2 mm; pressure: 70 N; speed: 150 mm/s. The entire back is printed using the standard Al paste. The printed paste thickness is about 22 µm. The amount of paste is 2.64 $mg/cm^2$. For drying, the printed wafer is warmed at up to 290° C. for a period of about 3 minutes. A belt furnace is used for this purpose.

Front Contact in the Highly Doped Areas (Lines):

The paste can be applied using a screen-printing machine which is sold under the name "Baccini printer" (with four cameras). For the process described, the DuPont Comp. PV 145 silver paste is used. The paste is printed using a screen from Koenen with the specification 280 mesh/inch and a wire diameter of 25 µm. The mounting angle of the screen is preferably 22.5°. The screen emulsion used is ISAR from Koenen. The paste can be printed very well using a diamond doctor and a doctor hardness of 60 shore. The following parameters are set for the paste printing: separation: 1.2 mm; pressure: 70 N; speed: 160 mm/s. The front layout with two busbars and fingers is printed using the silver paste. The line width is 80 µand the separation between the fingers is 1.7 mm. The width of the main busbars is 2 mm. The printed paste thickness is about 20 µm. For drying, the printed wafer is warmed at up to 290° C. for a period of about 3 minutes. A belt furnace is used for this purpose.

Firing Conditions:

The silicon wafers printed using metal paste are transported through an IR belt belt furnace and fired up to a maximum temperature of 880° C. This heating step serves both to burn out the organic paste components and also to sinter and melt the metal particles and the glass frit components. This produces a surface contact which is stable in the long term (prior art: "co-firing" and "ARC firing through"). For the burning out, a belt furnace with 7 zones is used in the process described. Temperature profile: 250-350-400-480-560-560-880° C. The The belt speed is 1.5 m/min.

Properties of the Selective Emitter:

For etching the shallow emitter, the isishape SolarEtch BES etching paste is used. The previously doped deep emitter having a layer resistance of 40 ohm/sq is etched to a layer resistance of 100 ohm/sq. An etching depth of about 40-50 nm is necessary for this purpose.

The emitters produced in this way have characteristic profiles of the phosphorus concentration in relation to the depth of diffusion, as shown in FIG. 11.

In order to characterise the solar cells produced, current-voltage characteristic lines (I-V) of the solar cells produced are measured by means of a sunlight simulator (Xe ars lamp) under standard conditions (STC 1000 W/sqm, AM 1.5, temperature: 25° C.) (cf. FIG. 12).

Corresponding measurements have shown that solar cells comprising one-step selective emitters with an efficiency increased by >0.5% compared with the efficiencies of standard solar cells can be produced with the aid of the process according to the invention.

ETCHING-PASTE EXAMPLES

Example 1

14 g of polyvinylpyrrolidone are added with vigorous stirring to a solvent mixture consisting of 125 g of phosphoric acid (85%) and 75 g of diethylene glycol monoethyl ether (DEGMEE) mixed with DMSO (1:1). 64 g of carbon black are then added to the clear homogeneous mixture, and the mixture is stirred for a further 2 hours.

Example 2

16 g of polyvinylpyrrolidone are added with vigorous stirring to a solvent mixture consisting of 74.5 g of phosphoric acid (85%) and 75 g of diethylene glycol monoethyl ether (DEGMEE) mixed with DMSO (1:1). 50 g of Ceridust are then added to the clear homogeneous mixture, and the mixture is stirred for a further 2 hours.

Example 3

17 g of polyvinylpyrrolidone are added with vigorous stirring to a solvent mixture consisting of 165 g of phosphoric acid (85%) and 85 g of diethylene glycol monoethyl ether (DEGMEE) mixed with DMSO (1:1). 70 g of Ceridust 9202 F are then added to the clear homogeneous mixture, and the mixture is stirred for a further 2 hours.

Example 4

Alternative etching paste comprising KOH 15 g of hydroxypropylcellulose are added with vigorous stirring to a solvent mixture consisting of 250 g of KOH solution (60%) and 520 g of gamma-butyrolactone. 70 g of Ceridust 9202 F are then added to the clear homogeneous mixture, and the mixture is stirred for a further 2 hours.

The paste, which is now ready to use, can be printed using a 280 mesh stainless-steel woven screen. In principle, polyesters or similar screen materials can also be used.

In storage trials, the etching paste prepared has proven to be stable on storage over a long time with retention of the advantageous etching properties.

Further examples of compositions according to the invention having advantageous properties are shown in Table 1 below:

TABLE 1

| Batch | Triethylene glycol monomethyl ether [g] | $H_2O$ [g] | Stabileze QM [g] | DMSO [g] | Natrosol GR250 [g] | Lactic acid (90%) [g] | H3PO4 (85%) [g] | Diethylene glycol monoethyl ether [g] | Carbon black [g] | Graphite [g] | Ethylene glycol [g] | PVP [g] |
|---|---|---|---|---|---|---|---|---|---|---|---|---|
| 1  | 0 | 218 | 8   | 4 | 8    | 0 | 465 | 223 | 19 | 0 | 1.6 | 0    |
| 2  | 0 | 219 | 7.7 | 4 | 8.5  | 0 | 463 | 223 | 17 | 0 | 2   | 0    |
| 3  | 0 | 220 | 7.4 | 8 | 9    | 0 | 461 | 223 | 15 | 0 | 2.4 | 0    |
| 4  | 0 | 221 | 7.1 | 8 | 9.5  | 0 | 459 | 223 | 13 | 0 | 2.8 | 0    |
| 5  | 0 | 222 | 6.8 | 0 | 10   | 0 | 457 | 223 | 11 | 0 | 3.2 | 0    |
| 6  | 0 | 223 | 6.5 | 0 | 10.5 | 0 | 455 | 223 | 9  | 0 | 3.6 | 0    |
| 7  | 0 | 224 | 6.2 | 0 | 11   | 0 | 453 | 223 | 7  | 0 | 3   | 0    |
| 8  | 0 | 225 | 5.9 | 0 | 11.5 | 0 | 451 | 223 | 8  | 0 | 2.4 | 0    |
| 9  | 0 | 226 | 5.6 | 0 | 12   | 0 | 449 | 223 | 9  | 0 | 1.8 | 0    |
| 10 | 0 | 227 | 5.3 | 0 | 12.5 | 0 | 447 | 223 | 10 | 0 | 1.2 | 0    |
| 11 | 0 | 228 | 5   | 0 | 13   | 0 | 445 | 223 | 11 | 0 | 0.6 | 0    |
| 12 | 0 | 229 | 4.7 | 0 | 13.5 | 0 | 443 | 223 | 12 | 0 | 0   | 0    |
| 13 | 0 | 0   | 0   | 0 | 0    | 0 | 450 | 466 | 13 | 0 | 0   | 60   |
| 14 | 0 | 0   | 0   | 0 | 0    | 0 | 452 | 464 | 19 | 0 | 0   | 59.5 |
| 15 | 0 | 0   | 0   | 0 | 0    | 0 | 454 | 462 | 25 | 0 | 0   | 59   |
| 16 | 0 | 0   | 0   | 0 | 0    | 0 | 456 | 460 | 31 | 0 | 0   | 58.5 |
| 17 | 0 | 0   | 0   | 0 | 0    | 0 | 458 | 458 | 37 | 0 | 0   | 58   |
| 18 | 0 | 0   | 0   | 0 | 0    | 0 | 460 | 456 | 43 | 0 | 0   | 57.5 |
| 19 | 0 | 0   | 0   | 0 | 0    | 0 | 462 | 454 | 49 | 0 | 0   | 57   |
| 20 | 0 | 0   | 0   | 0 | 0    | 0 | 464 | 452 | 55 | 0 | 0   | 56.5 |
| 21 | 0 | 0   | 0   | 0 | 0    | 0 | 450 | 466 | 61 | 0 | 0   | 60   |
| 22 | 0 | 0   | 0   | 0 | 0    | 0 | 452 | 464 | 47 | 0 | 0   | 59.5 |
| 23 | 0 | 0   | 0   | 0 | 0    | 0 | 454 | 462 | 48 | 0 | 0   | 59   |
| 24 | 0 | 0   | 0   | 0 | 0    | 0 | 456 | 460 | 50 | 0 | 0   | 58.5 |
| 25 | 0 | 0   | 0   | 0 | 0    | 0 | 458 | 458 | 52 | 0 | 0   | 58   |
| 26 | 0 | 0   | 0   | 0 | 0    | 0 | 460 | 0   | 68 | 0 | 0   | 30   |
| 27 | 0 | 0   | 0   | 0 | 0    | 0 | 462 | 0   | 51 | 0 | 0   | 35   |
| 28 | 0 | 0   | 0   | 0 | 0    | 5 | 464 | 5   | 50 | 0 | 0   | 56.5 |
| 29 | 1 | 0   | 0   | 0 | 0    | 5 | 466 | 10  | 49 | 0 | 0   | 56   |
| 30 | 2 | 0   | 0   | 0 | 0    | 5 | 468 | 15  | 48 | 0 | 0   | 55.5 |
| 31 | 2 | 0   | 0   | 0 | 0    | 0 | 470 | 20  | 47 | 0 | 0   | 55   |

The invention claimed is:

1. A process for production of solar cells comprising a selective emitter with one-step diffusion, said process comprising: etching in a single etching step a phosphosilicate glass layer and an underlying silicon layer with a printed-on etching paste.

2. The process according to claim 1, wherein said etching provides is and wherein said etching paste is a phosphoric acid-containing etching paste.

3. The process according to claim 1, wherein the etching of said phosphosilicate glass layer and said underlying silicon layer produces a silicon surface having increased microroughness of the actual texture.

4. The process according to claim 1, wherein said etching of said phosphosilicate glass layer and underlying silicon layer is performed after the surface of the silicon layer is textured with a pyramidal or amorphous structure, and said etching produces increased microroughness of the actual texture of said surface of the silicon layer.

5. The process according to claim 1, comprising the following process steps:
   I. Texturing of the surface of said silicon layer with KOH/isopropanol or HF/HNO3;
   II. Phosphorus doping (~35-40 Ω/sq diffusion of $POCl_3$);
   III. Local etching of the phosphosilicate glass layer and underlying silicon layer, producing a conductivity in the range ~80-100 Ω/sq, and cleaning;
   IV. phosphosilicate glass etching;
   V. Deposition of the antireflective layer by means of plasma enhanced chemical vapor deposition of silicon nitride ($SiN_x$);
   VI. Screen printing for metallization of the surface (front) and back with subsequent sintering (co-firing); and
   VII. Edge insulation.

6. The process according to claim 1, comprising the following process steps:
   I. Texturing of the surface of said silicon layer with KOH/isopropanol or $HF/HNO_3$;
   II. phosphosilicate glass etching, 40 Ω/sq diffusion ($POCl_3$);
   III. phosphosilicate glass etching;
   IV. Printing-on of Solar Etch®, Si etching, in order to obtain a resistance of 100 Ω/sq and cleaning with deionised water and/or 0.05% KoH solution;
   V. Deposition of an antireflective coating by plasma enhanced chemical vapor deposition for the deposition of silicon nitride ($SiN_x$);
   VI. Screen printing on the front and back for metallization of the surface on the front and back with subsequent sintering; and
   VII. Edge insulation.

7. The process according to claim 5, wherein cleaning is carried out with deionised water and/or 0.05% KOH solution.

8. The process according to claim 5, wherein back edge insulation is additionally carried out by an etching step.

9. The process of claim 1, wherein the etching paste is a phosphoric acid-containing etching paste.

10. A solar cell comprising a selective emitter prepared by the process according to claim 2.

11. The process of claim 9, wherein said etching paste comprises phosphoric acid in an amount of 25 to 80% by weight.

12. The process according to claim 11, wherein said etching paste comprising a solvent or solvent mixture in an amount of 20 to 40% by weight.

13. The process of claim 12, wherein said solvent is selected from glycerol, diethylene glycol monomethyl ether, diethylene glycol monoethyl ether, dimethyl sulfoxide and gamma-butyrolactone, in each case in pure form or as a mixture.

14. The process of claim 11, wherein said etching paste comprises at least one non-particulate thickener.

15. The process of claim 11, wherein said etching paste comprises a non-particulate thickener selected from polyvinylpyrrolidone and hydroxypropylcellulose, in each case in pure form or as a mixture.

16. The process of claim 11, wherein said etching paste comprises a particulate thickener selected from carbon black and low-melting wax particles, in each case in pure form or as a mixture.

17. The process of claim 11, wherein said etching paste comprises a thickener in an amount of 20 -35% by weight.

* * * * *